(12) United States Patent
Kim et al.

(10) Patent No.: US 8,642,474 B2
(45) Date of Patent: Feb. 4, 2014

(54) SPACER LITHOGRAPHY

(75) Inventors: Ryoung-han Kim, San Jose, CA (US); Yunfei Deng, Sunnyvale, CA (US); Thomas I. Wallow, San Carlos, CA (US); Bruno La Fontaine, Pleasanton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1905 days.

(21) Appl. No.: 11/775,727

(22) Filed: Jul. 10, 2007

(65) Prior Publication Data

US 2009/0017628 A1  Jan. 15, 2009

(51) Int. Cl.
  *H01L 21/311*  (2006.01)
(52) U.S. Cl.
  USPC .................................. 438/700; 257/E21.258
(58) Field of Classification Search
  USPC .......................................................... 438/700
  See application file for complete search history.

(56) References Cited

U.S. PATENT DOCUMENTS

| | | | | |
|---|---|---|---|---|
| 4,502,914 A | * | 3/1985 | Trumpp et al. | 438/424 |
| 4,784,718 A | * | 11/1988 | Mitani et al. | 438/183 |
| 4,803,181 A | * | 2/1989 | Buchmann et al. | 438/696 |
| 5,322,764 A | * | 6/1994 | Kamiyama et al. | 430/324 |
| 5,618,383 A | * | 4/1997 | Randall | 430/314 |
| 5,654,202 A | * | 8/1997 | Daly et al. | 438/70 |
| 5,710,066 A | * | 1/1998 | Okamoto et al. | 216/46 |
| 5,795,830 A | * | 8/1998 | Cronin et al. | 438/696 |
| 5,858,620 A | * | 1/1999 | Ishibashi et al. | 430/313 |
| 6,001,739 A | * | 12/1999 | Konishi | 438/692 |
| 6,063,688 A | * | 5/2000 | Doyle et al. | 438/424 |
| 6,074,804 A | * | 6/2000 | Endo et al. | 430/322 |
| 6,124,081 A | * | 9/2000 | Kishimura | 430/323 |
| 6,183,938 B1 | * | 2/2001 | Lyons et al. | 430/313 |
| 6,239,008 B1 | * | 5/2001 | Yu et al. | 438/587 |

(Continued)

FOREIGN PATENT DOCUMENTS

JP  408321613  * 5/1995 ............ H01L 29/78

OTHER PUBLICATIONS

Advance Micro Devices, Inc., International Search Report, Sep. 10, 2008, 13 pages.

(Continued)

*Primary Examiner* — N Drew Richards
*Assistant Examiner* — Ankush Singal
(74) *Attorney, Agent, or Firm* — Ditthavong Mori & Steiner, P.C.

(57) ABSTRACT

Ultrafine dimensions are accurately and efficiently formed in a target layer using a spacer lithographic technique comprising forming a first mask pattern, forming a cross-linkable layer over the first mask pattern, forming a cross-linked spacer between the first mask pattern and cross-linkable layer, removing the cross-linkable layer, cross-linked spacer from the upper surface of the first mask pattern and the first mask pattern to form a second mask pattern comprising remaining portions of the cross-linked spacer, and etching using the second mask pattern to form an ultrafine pattern in the underlying target layer. Embodiments include forming the first mask pattern from a photoresist material capable of generating an acid, depositing a cross-linkable material comprising a material capable of undergoing a cross-linking reaction in the presence of an acid, and removing portions of the non-cross-linked layer and cross-linked spacer from the upper surface of the first mask pattern before removing the remaining portions of the first mask pattern and remaining noncross-linked layer.

19 Claims, 6 Drawing Sheets

(56) References Cited

U.S. PATENT DOCUMENTS

| | | | |
|---|---|---|---|
| 6,291,137 B1 * | 9/2001 | Lyons et al. | 430/313 |
| 6,300,684 B1 * | 10/2001 | Gonzalez et al. | 257/774 |
| 6,319,853 B1 * | 11/2001 | Ishibashi et al. | 438/780 |
| 6,331,378 B1 * | 12/2001 | Endo | 430/314 |
| 6,335,531 B1 * | 1/2002 | Somerville et al. | 250/459.1 |
| 6,362,057 B1 * | 3/2002 | Taylor et al. | 438/286 |
| 6,376,157 B1 * | 4/2002 | Tanaka et al. | 430/314 |
| 6,383,952 B1 | 5/2002 | Subramanian et al. | |
| 6,492,075 B1 * | 12/2002 | Templeton et al. | 430/5 |
| 6,534,243 B1 * | 3/2003 | Templeton et al. | 430/312 |
| 6,555,607 B1 * | 4/2003 | Kanda et al. | 524/366 |
| 6,566,280 B1 * | 5/2003 | Meagley et al. | 438/780 |
| 6,579,657 B1 * | 6/2003 | Ishibashi et al. | 430/270.1 |
| 6,593,063 B1 * | 7/2003 | Tanaka et al. | 430/311 |
| 6,638,441 B2 * | 10/2003 | Chang et al. | 216/46 |
| 6,663,761 B2 * | 12/2003 | Kamijima | 205/122 |
| 6,862,798 B2 * | 3/2005 | Kruger et al. | 29/603.13 |
| 6,905,975 B2 * | 6/2005 | Boettiger et al. | 438/745 |
| 7,100,275 B2 * | 9/2006 | Toyoshima et al. | 29/830 |
| 7,172,974 B2 * | 2/2007 | Choi et al. | 438/709 |
| 7,338,750 B2 * | 3/2008 | Kozawa et al. | 430/314 |
| 7,361,448 B2 * | 4/2008 | Nozaki et al. | 430/270.1 |
| 7,361,454 B2 * | 4/2008 | Kobayashi | 430/313 |
| 7,396,781 B2 * | 7/2008 | Wells | 438/448 |
| 7,429,536 B2 * | 9/2008 | Abatchev et al. | 438/725 |
| 7,439,193 B2 * | 10/2008 | Li et al. | 438/780 |
| 7,455,950 B2 * | 11/2008 | Endo et al. | 430/270.1 |
| 7,455,956 B2 * | 11/2008 | Sandhu et al. | 430/313 |
| 7,488,685 B2 * | 2/2009 | Kewley | 438/689 |
| 7,498,225 B1 * | 3/2009 | Wang et al. | 438/283 |
| 7,592,127 B2 * | 9/2009 | Nozaki et al. | 430/273.1 |
| 7,625,688 B2 * | 12/2009 | Nozaki et al. | 430/270.1 |
| 2003/0157801 A1 * | 8/2003 | Kozawa et al. | 438/689 |
| 2003/0175624 A1 * | 9/2003 | Nozaki et al. | 430/296 |
| 2004/0018646 A1 * | 1/2004 | Tarutani et al. | 438/4 |
| 2004/0164835 A1 * | 8/2004 | Shoji | 336/200 |
| 2005/0130068 A1 * | 6/2005 | Kondoh et al. | 430/312 |
| 2005/0227151 A1 * | 10/2005 | Hata et al. | 430/5 |
| 2006/0188807 A1 * | 8/2006 | Nozaki et al. | 430/270.1 |
| 2006/0189147 A1 * | 8/2006 | Shiobara et al. | 438/725 |
| 2007/0042611 A1 * | 2/2007 | McMonagle | 438/780 |
| 2007/0048659 A1 * | 3/2007 | Namiki et al. | 430/270.1 |
| 2007/0082496 A1 * | 4/2007 | Orii et al. | 438/737 |
| 2007/0128559 A1 * | 6/2007 | Ishibashi et al. | 430/330 |
| 2008/0064213 A1 * | 3/2008 | Jung | 438/696 |
| 2008/0076255 A1 * | 3/2008 | Hata et al. | 438/694 |
| 2008/0274431 A1 * | 11/2008 | Nozaki et al. | 430/319 |
| 2009/0011374 A1 * | 1/2009 | Chang et al. | 430/323 |

OTHER PUBLICATIONS

Written Opinion of the International Searching Authority for corresponding PCT Application No. PCT/US2008/008470, Sep. 10, 2008, pp. 8-12.

* cited by examiner

SPACER LITHOGRAPHY

FIELD OF THE INVENTION

The present invention relates to the fabrication of semiconductor devices having accurately formed ultrafine design features. The present invention is particularly applicable to fabricating semiconductor devices having high speed integrated circuits with design features in the deep sub-micron range in an efficient manner with increased manufacturing throughput.

BACKGROUND ART

The dimensions of semiconductor device features relentlessly plunge into the deep sub-micron range, as in the decananometer range, challenging conventional fabrication techniques. As critical dimensions shrink, it becomes increasingly more difficult to achieve high dimensional accuracy in an efficient manner with high manufacturing throughput. The minimum feature size depends upon the chemical and optical limits of a particular lithography system, and the tolerance for distortions of the shape. In addition to the limitations of conventional lithography, the manufacturing costs attendant upon accurately forming ultrafine design features increase, thereby requiring advances in processing designed for efficient use of facilities and high manufacturing throughput.

Double exposure techniques that involve spacer lithographic processes have evolved. However, these techniques have not been completely successful and suffer from low manufacturing throughput, some techniques requiring the use of various tools and frequent chemical mechanical polishing (CMP). Transportation of a wafer from one tool to another and frequent use of CMP are not only time consuming but inevitably results in reduced yield thereby placing a chip maker at a disadvantage. In today's competitive market, a yield of at least 70% is required for profitability.

Accordingly, a need exists for methodology enabling the fabrication of semiconductor chips comprising devices having accurately formed features in the deep sub-micron range, such as design features less than 35 nm, including design features less than 20 nm, e.g., less than 10 nm. There exists a particular need for such methodology enabling the accurate formation of ultrafine design features with high efficiency and high manufacturing throughput.

DISCLOSURE OF THE INVENTION

An advantage of the present invention is a method of fabricating semiconductor devices having accurately formed features with dimensions in the deep sub-micron range.

Another advantage of the present invention is an efficient method of fabricating semiconductor devices having accurately formed sub-micron features at high manufacturing throughput.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of fabricating a semiconductor device, the method comprising: forming a first mask pattern over a target layer; forming a cross-linkable layer over the first mask pattern; forming a cross-linked spacer between the first mask pattern and the cross-linkable layer; and removing the cross-linkable layer, sufficient portions of the cross-linked spacer to expose the first mask layer, and the first mask layer to form a second mask pattern comprising remaining portions of the cross-linked spacer.

Another advantage of the present invention is a method of fabricating a semiconductor device, the method comprising forming a first photoresist mask pattern over a target layer, the first mask pattern having upper and side surfaces and comprising a material capable of generating an acid; forming a cross-linkable layer, comprising a material capable of undergoing a cross-linking reaction in the presence of an acid, on the first photoresist mask pattern; generating an acid in the first photoresist mask pattern by heating or irradiation; heating to diffuse the acid to the cross-linkable layer to form a cross-linked spacer on the upper and side surfaces of the first photoresist mask pattern; removing portions of the cross-linkable layer to expose the cross-linked spacer on the upper surfaces of the first photoresist mask pattern and removing the exposed cross-linked spacer from the upper surfaces of the first photoresist mask pattern, leaving the cross-linked spacer on the side surfaces of the first photoresist mask pattern; removing remaining portions of the cross-linkable layer and removing the first photoresist mask pattern to form a second mask pattern comprising the cross-linked spacer previously on the side surfaces of the first photoresist mask pattern; and etching the target layer using the second mask pattern.

A further advantage of the present invention is a method of fabricating a semiconductor device, the method comprising forming a first mask pattern over a target layer, the first mask pattern comprising a first organic material; forming a layer comprising a second organic material capable of undergoing a cross-linking reaction in the presence of an acid; forming and diffusing an acid to the second organic material to cross-link a portion thereof to form a cross-linked spacer on the first mask pattern; etching to remove a portion of the second organic material and cross-linked spacer sufficient to expose the first mask pattern; and etching to remove remaining portions of the second organic material and first mask pattern to form a second mask pattern comprising remaining portions of the cross-linked spacer.

Embodiments of the present invention comprise forming the spacer layer at a thickness of less than 35 nm and etching, as by a timed etching technique, to remove both a portion of the second organic material and portions of the cross-linked spacer layer sufficient to expose the first mask pattern, followed by etching to remove both the remaining portions of the second organic material and first mask pattern. Embodiments of the present invention include forming the first mask pattern from a photoresist material comprising a novolac resin, a napthoquinonediazde-based photo sensitive agent and a cholo-methyl-triazine acid generator, or forming the first organic material from a polyhydroxy-styrene derivative and an onium salt functioning as a photo-assisted acid generator. Embodiments of the present invention also include depositing an organic material comprising a water-soluble resin as the cross-linkable layer.

Additional advantages of the present invention will become readily apparent to those skilled in the art from the following detailed description, wherein embodiments of the present invention are described, simply by way of illustration of the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

In FIGS. 1 through 6, similar features are denoted by like reference characters.

DESCRIPTION OF THE INVENTION

Figure 1:
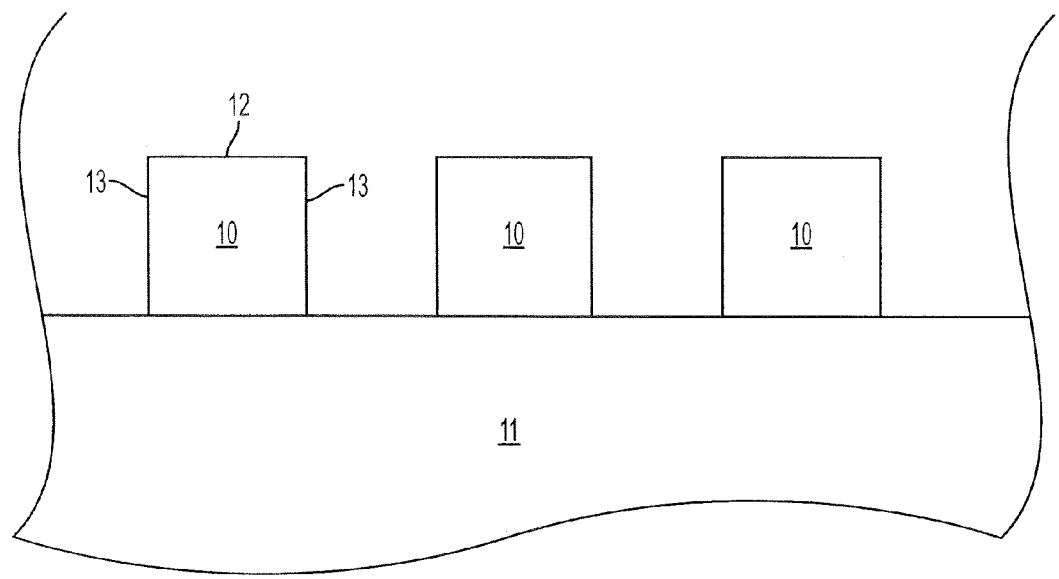
FIGS. 1 through 6 are cross sectional views schematically illustrating sequential phases of a method in accordance with an embodiment of the present invention.

The present invention addresses and solves problems attendant upon fabricating semiconductor devices with accurately formed ultrafine design features less than 35 nm, such as less than 20 nm, e.g., less than 10 nm. These problems stem from dimensional restrictions imposed by the chemical and optical limits of conventional lithography systems, misalignment stemming from multiple exposure steps with intervening processing, and distortions of feature shape. Conventional fabrication techniques have been challenged to keep pace with the demands for accurately formed ultrafine design features, particularly in an efficient manner to enable high manufacturing throughput to remain competitive. Operations such as multiple exposures, transporting wafers among different tools and, notably, chemical mechanical processing (CMP) operations, reduce manufacturing throughput, thereby adversely impacting profitability.

Conventional lithographic practices have fallen short of satisfying the relentless demand for accurately formed finer and finer device features, particularly in an efficient manner with increased manufacturing throughput. For example, conventional practices frequently involve the use of several different tools during lithographic stages, including multiple exposures with attendant misalignment issues, and frequently require CMP. The use of different tools and CMP, particularly on dielectric surfaces, not only consumes time but opens the door to increased chip rejection and, hence, reduced manufacturing throughput and reduced profitability.

The present invention provides methodology enabling the formation of chips comprising various types of semiconductor devices having accurately formed ultrafine design features in an efficient manner with increased manufacturing throughput. In accordance with embodiments of the present invention, a first mask pattern is formed over a target layer in which an ultrafine pattern is to be formed. A cross-linked spacer is formed on the first mask pattern. A second mask pattern is subsequently formed which comprises portions of the cross-linked spacer. The thickness of the spacer is controlled to achieve accurate ultrafine self-aligned features, such as less than 35 nm.

Sequential phases of an embodiment of the present invention are schematically illustrated in FIGS. 1 through 6, wherein similar features are denoted by similar reference characters. Adverting to FIG. 1, a first mask pattern comprising spaced apart portions 10 is formed over a target layer 11. Target layer 11 can be any of various layers formed during conventional semiconductor fabrication techniques to be etched, such as a conductive or semiconductor layer wherein gate electrodes are formed. The first mask pattern typically comprises an organic material, such as a photoresist material, and can contain a component which is capable of causing a reaction, such as a cross-linking reaction, in a subsequently applied layer. In accordance with some embodiments of the present invention, first mask pattern 10 comprises a photoresist material capable of generating an acid. Suitable materials include a mixture of a novolac resin, a napthoquinonediazde-based photo-sensitive agent, and a cholo-methyl-triazine functioning as an acid generator. Some embodiments of the present invention also include forming the first mask pattern from a mixture comprising a poly-hydroxy-styrene derivative and an onium salt which functions as a photo-assisted acid generator. The first mask layer can be formed of a chemically amplified resist which employs a mechanism of producing an acid when is exposed to certain types of radiation, such as UV rays, an electron beam or X-rays, or when heated.

Figure 2:
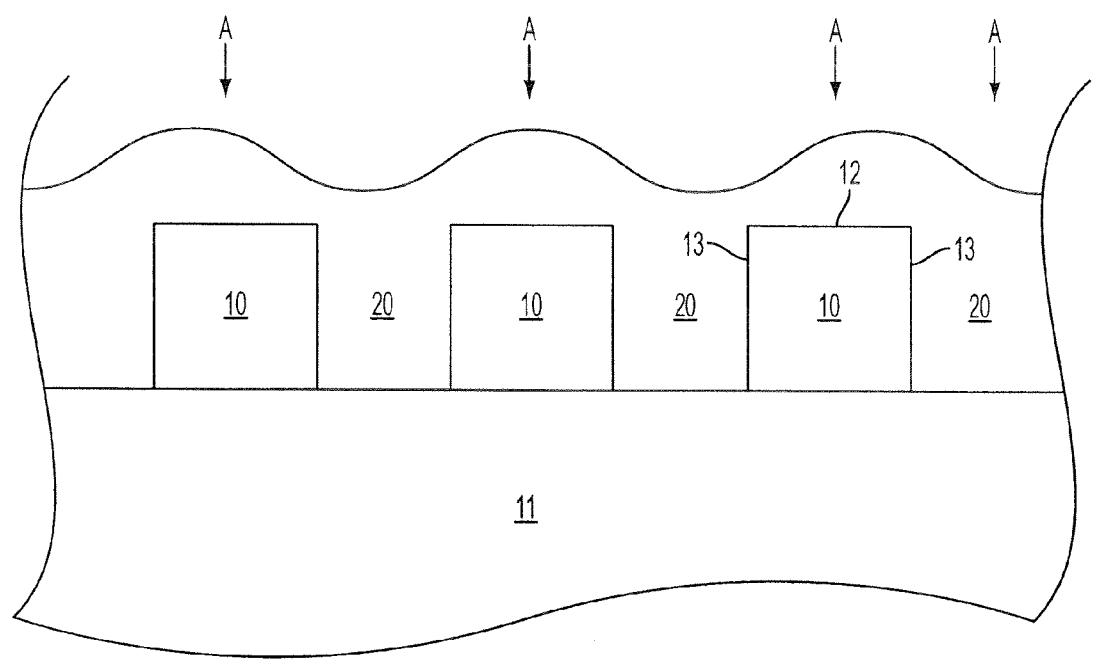

Adverting to FIG. 2, layer 20 is deposited covering the first mask pattern 10. In some embodiments of the present invention, layer 20 comprises a material capable of undergoing a cross-linking reaction, such as a material capable of undergoing a cross-linking reaction in the presence of an acid. Suitable materials for layer 20 include water-soluble and water-insoluble resins, water-soluble and water-insoluble resins which cause a cross-linking reaction in the presence of an acid, water-soluble and water-insoluble cross-linking agents, and mixtures thereof. Some embodiments of the present invention, a water-soluble resin is selected from the group consisting of a polyacrylic acid, polyvinyl acetal, polyvinylpyrrolidone, polyvinyl alcohol, polyethyleneimine, styrene-maleic anhydride copolymer, polyvinylamine, polyallylamine, oxazoline group-containing water-soluble resins, water-soluble urethane, water-soluble phenol, water-soluble epoxy, water-soluble melamine resins, water-soluble urea resins, alkyd resins, sulfonamide, a salt thereof, and a mixture of two or more thereof. The water-soluble cross-linking agent can be one type of material or two or more types of materials selected from the group consisting of melamine-based cross-linking agents such as melamine derivatives or methyl-lolmelamine derivatives, urea-based cross-linking agents such as urea derivatives, methyloy urea derivatives, ethylene urea carboxylates, or methylol-ethylene-urea derivatives; and amino-based cross-linking agents such as benzoguanamine, gylcoluril, isocyanates.

In an embodiment of the present invention, the second layer 20 is formed of a polyvinyl acetal resin, and the amount thereof controlled by controlling the extent of acetalization of the polyvinyl acetal resin. In other embodiments of the present invention, layer 20 can comprise a material selected from a group of a mixture of polyvinyl acetal and methoxy-methylol-urea, a mixture of polyvinylyl acetal and methoxy-methylol-melamine, or a mixture of methyoxy-methylol-melamine and polyallyl-amine. In another embodiment of the present invention, it was found particularly suitable to use a cross-linker, such as JSR CSX004, distributed by JSR Micro, Inc., Sunnyvale, Calif. JSR CSX0004 is only slightly soluble in water.

Typically, the second layer 20 is deposited using a solvent which is incapable of dissolving the first resist pattern 10. Suitable solvents for depositing layer 20 include pure water or a mixture of pure water and an alcohol.

In accordance with some embodiments, a species capable of reacting or causing a cross-linking reaction with layer 20 is formed on or generated in the first mask pattern. Suitable treatments include irradiation with light having an appropriate wavelength, as illustrated by arrows A (FIG. 2), over the entire exposed surface. In another embodiment of the present invention, portions of first mask layer 10 can be selectively irradiated, as by shielding other portions, to generate an acid in selected portions 10 of the first mask pattern. In other embodiments of the present invention, laser thermal annealing can be performed to heat selected portions 10 of the first mask pattern to generate an acid. In cases where only certain portions 10 of the first mask pattern are selectively heated or treated, the cross-linked spacer layer would be formed only on the selectively heated or treated portions.

Figure 3:
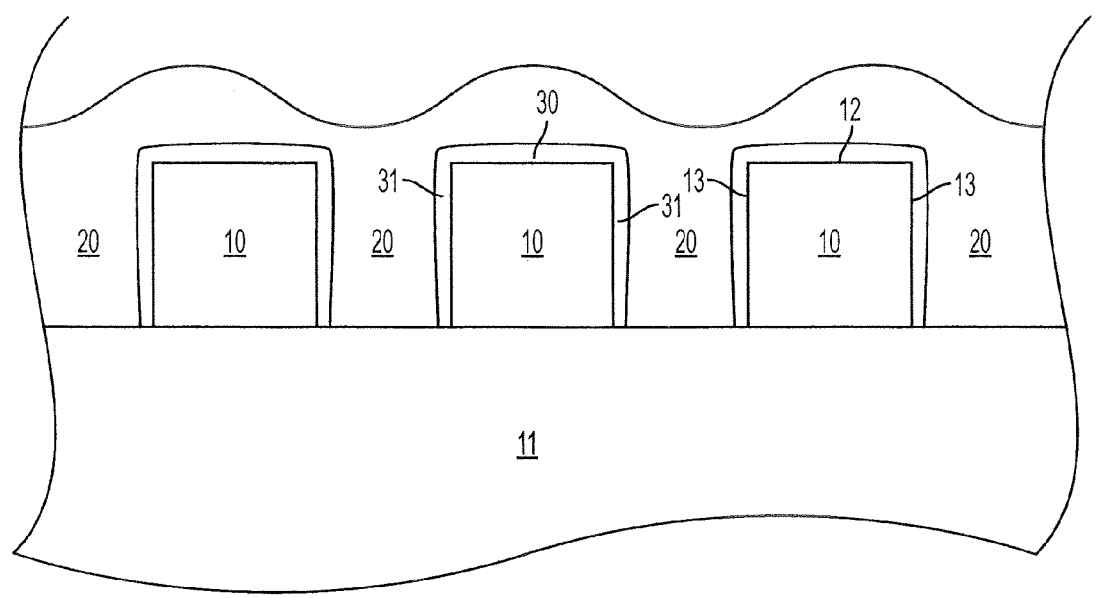

Adverting to FIG. 3, portions of layer 20 are caused to undergo a reaction to form a spacer over the first mask pattern. For example, the wafer can be baked, as by heating to a temperature of about 60° to about 130°, thereby permitting an acid generated in first mask pattern to diffuse to second layer 20 causing a cross-linking reaction to form a cross-linked spacer on the first mask pattern. As shown in FIG. 3, the cross-linked spacer comprises an upper portion 30 formed on the upper surfaces 12 of the first mask pattern 10 and side portions 31 formed on side surfaces 13 of first mask pattern 10. The amount of heating can be controlled by controlling the duration of heating, such as 60 seconds to 120 seconds, depending upon the particular material involved and the required thickness of the cross-linked spacer.

Figure 4:
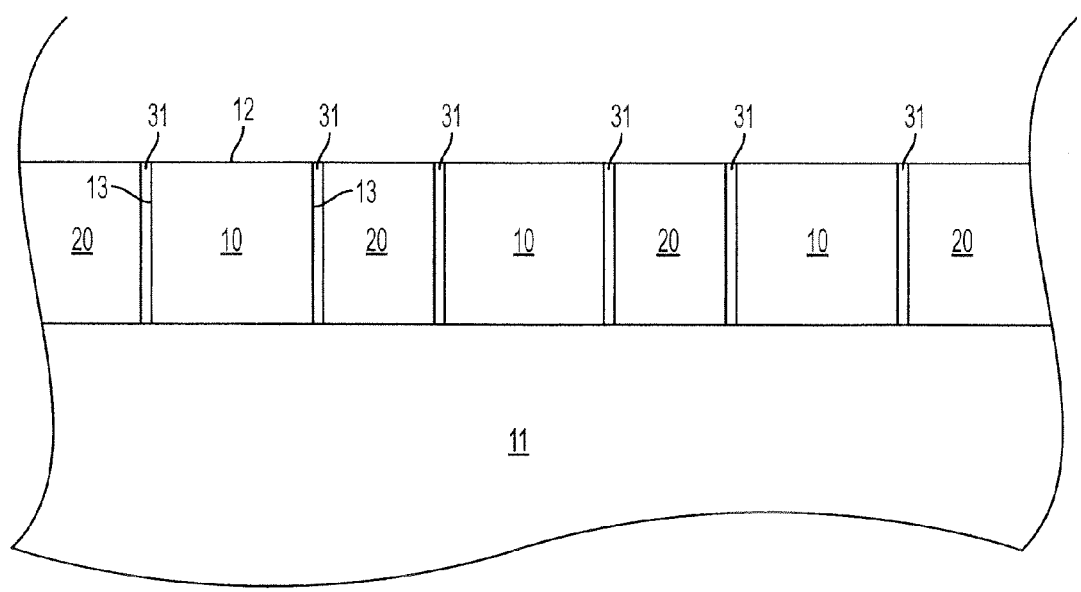

Subsequently, as schematically illustrated in FIG. 4, an upper portion of layer 20 and the upper portion 30 of the cross-linked spacer are removed. Such removal can be effected by either by chemical removal or CMP. However, in accordance with embodiments of the present invention CMP can be advantageously omitted, and the upper portions of layer 20 and upper portions 30 of the cross-linked spacer are removed by etching, as by selectively etching the upper portion of layer 20 followed by selectively etching to remove upper portion 30 of the cross-linked spacer. Alternatively, a timed etching technique can be employed to remove, separately or in one step, the upper portion of layer 20 and upper portion 30 of the cross-linked spacer to expose the upper surfaces 12 of portions 10 of the first mask pattern, as shown in FIG. 4. Suitable etchants to remove the upper portion of (uncross-linked) cross-linkable layer 20 and upper portions 30 of the cross-linked spacer include a gas etchant composition comprising, and $O_2$, $N_2$, and $C_xH_yF_z$.

Figure 5:
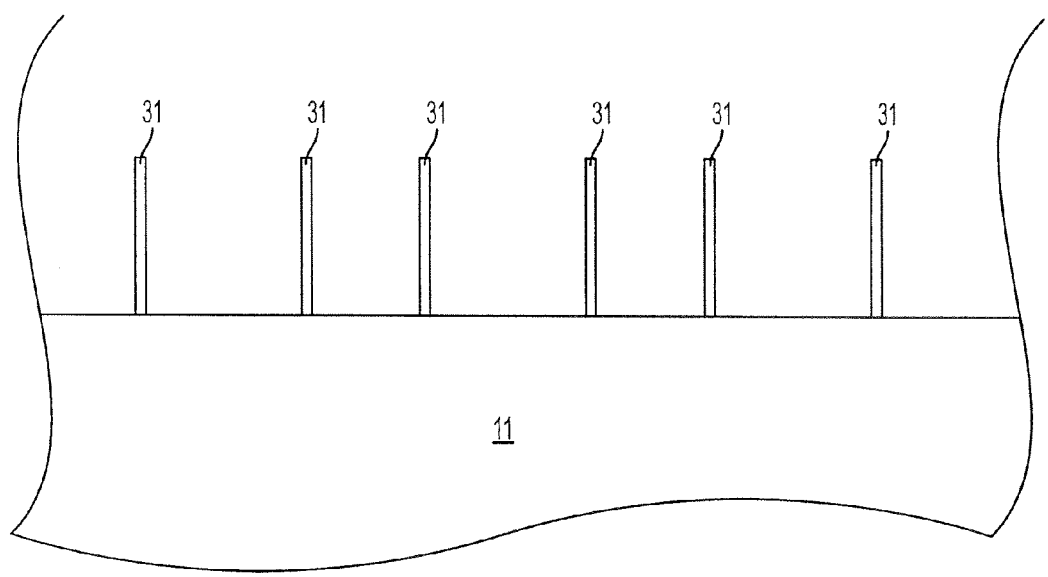
Figure 6:
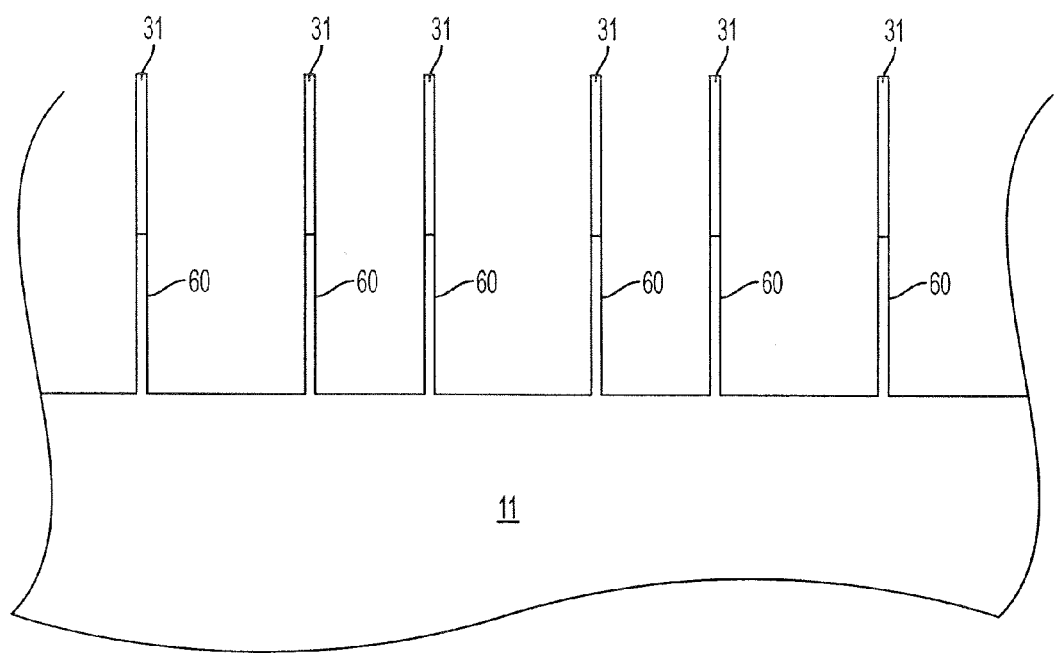

Adverting to FIG. 5, the remaining portion of (uncross-linked) cross-linkable layer 20 together with portions 10 of the first mask pattern are removed, as by etching, to form a second or final mask pattern comprising cross-linked portions 31 previously on side surfaces 13 of portions 10 of the first mask pattern. Suitable etchants to remove remaining uncross-linked layer 20 and portions 10 include gas etchant composition comprising $O_2$, $N_2$, and $C_xH_yF_z$. Subsequently, etching is conducted, using the second mask pattern, to form features 60 in target layer 11, such as gate electrodes. Features 60 are self-aligned with cross-linked spacer portions 31 and have a width similar to the thickness of spacer layer 31.

The present invention can be implemented using various types of materials and techniques. For example, an acid can be generated by the methods, and employing the materials, disclosed in U.S. Pat. No. 5,858,620 and in U.S. Pat. No. 6,319,853, the entire disclosure of each of which is hereby incorporated by reference herein. For example, prebaking may be performed after forming the first mask pattern and after depositing layer 20. An acid can be formed by means other than by irradiation, as by treating the first mask pattern with an acidic solution prior to depositing layer 20, and subsequently, heating to permit the acid to diffuse and cross-link a portion of layer 20.

Embodiments of the present invention advantageously employ organic materials for the first mask pattern and layer 20, thereby minimizing transportation among different tools. Further, in embodiments of the present invention, problematic CMP of an insulating layer can be avoided by etching, as by employing a timed etching technique. Embodiments of the present invention can be implemented using a single exposure step in forming the first mask pattern, thereby avoiding misalignment issues attendant upon a multiple exposures with intervening processing.

The present invention can be employed in the fabrication of semiconductor chips comprising any of various types of semiconductor devices, including semiconductor memory devices, such as eraseable, programmable, read-only memories (EPROMs), electrically eraseable programmable read-only memories (EEPROMs), and flash eraseable programmable read-only memories (FEPROMs). Semiconductor chips fabricated in accordance with embodiments of the present invention can be employed in various commercial electronic devices, such as computers, cellular telephones and digital cameras, and can easily be integrated with printer circuit boards in a conventional manner.

The present invention enables the efficient fabrication of semiconductor chips comprising devices with accurate ultrafine design features with high manufacturing throughput. The present invention enjoys industrial applicability in fabricating semiconductor chips useful in any of various types of industrial applications, including chips having highly integrated semiconductor devices, including flash memory semiconductor devices exhibiting increased circuit speed.

In the preceding description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not as restrictive. It is understood that the present invention is capable of using various other combinations and embodiments and is capable of any changes or modifications within the scope of the inventive concept as expressed herein.

What is claimed is:

1. A method of fabricating a semiconductor device, the method comprising:
   forming a first mask pattern over a target layer;
   forming a cross-linkable layer over the first mask pattern;
   forming a cross-linked spacer between the first mask pattern and the cross-linkable layer; and
   removing sufficient portions of the cross-linkable layer and cross-linked spacer to expose the first mask pattern, leaving remaining portions of the cross-linkable layer; followed by
   removing the remaining portions of the cross-linkable layer and the first mask layer to form a second mask pattern comprising remaining portions of the cross-linked spacer.

2. The method according to claim 1, further comprising etching a pattern in the target layer through the second mask pattern.

3. The method according to claim 1, comprising forming the cross-linked spacer at a thickness of less than 20 nm.

4. The method according to claim 1, wherein the cross-linkable layer comprises a material capable of undergoing a cross-linking reaction in the presence of an acid.

5. The method according to claim 1, comprising chemically removing sufficient portions of the cross-linkable layer and cross-linked spacer to expose the first mask pattern.

6. The method according to claim 2, where the target layer comprises a conductive or semiconductive layer.

7. The method according to claim 6, comprising etching to form gate electrodes.

8. The method according to claim 4, wherein:
   the first mask pattern comprises a material capable of generating an acid.

9. The method according to claim 8, comprising generating an acid in the first mask pattern after forming the cross-linkable layer.

10. The method according to claim 9, comprising generating the acid by irradiation or heating.

11. The method according to claim 9, comprising heating to diffuse the acid toward the cross-linkable material to form the cross-linked spacer.

12. The method according to claim 5, comprising removing sufficient portions of the cross-linkable layer and cross-linked spacer to expose the first mask pattern by a timed etching technique.

13. A method of fabricating a semiconductor device, the method comprising:
   forming a first photoresist mask pattern over a target layer, the first photoresist mask pattern having upper and side surfaces and comprising a material capable of generating an acid;
   forming a cross-linkable layer, comprising a material capable of undergoing a cross-linking reaction in the presence of an acid, on the first photoresist mask pattern;
   generating an acid in the first photoresist mask pattern by heating or irradiation;
   heating to diffuse the acid to the cross-linkable layer to form a cross-linked spacer on the upper and side surfaces of the first photoresist mask pattern;
   removing sufficient portions of the cross-linkable layer to expose the cross-linked spacer on the upper surfaces of the first photoresist mask pattern, leaving remaining portions of the cross-linkable layer; followed by
   removing the exposed cross-linked spacer from the upper surfaces of the first photoresist mask pattern, leaving the cross-linked spacer on the side surfaces of the first photoresist mask pattern; followed by
   removing the remaining portions of the cross-linkable layer and removing the first photoresist mask pattern to form a second mask comprising the cross-linked spacer previously on the side surfaces of the first photoresist mask layer; and
   etching the underlying target layer using the second mask pattern.

14. The method according to claim 13, comprising:
   etching to remove the cross-linkable layer, cross-linked spacer layer from the upper surfaces of the first photoresist mask layer, and the first photoresist mask layer.

15. A method of fabricating a semiconductor device, the method comprising:
   forming a first mask pattern over a target layer, the first mask pattern comprising a first organic material;
   forming a layer comprising a second organic material capable of undergoing a cross-linking reaction in the presence of an acid;
   forming and diffusing an acid to the second organic material to cross-link a portion thereof to form a cross-linked spacer on the first mask pattern;
   etching to remove a sufficient portion of the second organic material and cross-linked spacer sufficient to expose the first mask pattern, leaving remaining portions of the second organic material; and
   etching to remove the remaining portions of the second organic material and the first mask pattern to form a second mask pattern comprising remaining portions of the cross-linked spacer.

16. The method according to claim 15, wherein the first organic material is capable of generating an acid, the method comprising:
   forming the acid by irradiating the first organic material; and
   heating to diffuse the acid.

17. The method according to claim 16, wherein:
   the first organic material comprises a novolac resin, a napthoquinonediazde-based photo sensitive agent and a cholo-methyl-triazine acid generator, or a polyhydroxystyrene derivative and an onium salt.

18. The method according to claim 17, wherein the second organic material is a water-soluble resin.

19. The method according to claim 17, comprising forming the acid by treating the first mask pattern with an acid solution.

* * * * *